United States Patent
Min et al.

(10) Patent No.: US 12,515,356 B2
(45) Date of Patent: Jan. 6, 2026

(54) NON-CONTACT TYPE GRIPPER

(71) Applicant: Samsung Electronics Co., Ltd., Suwon-si (KR)

(72) Inventors: Daeho Min, Suwon-si (KR); Minwoo Rhee, Suwon-si (KR); Juno Kim, Suwon-si (KR); Kazuya Ono, Suwon-si (KR); Kangsan Lee, Suwon-si (KR); Kyeongbin Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 328 days.

(21) Appl. No.: 18/206,635

(22) Filed: Jun. 7, 2023

(65) Prior Publication Data

US 2024/0139972 A1 May 2, 2024

(30) Foreign Application Priority Data

Oct. 31, 2022 (KR) .................. 10-2022-0142087

(51) Int. Cl.
*B25J 15/06* (2006.01)
*B25J 11/00* (2006.01)

(52) U.S. Cl.
CPC ....... *B25J 15/0658* (2013.01); *B25J 11/0095* (2013.01)

(58) Field of Classification Search
CPC ............... B25J 15/0658; B25J 11/0095; H01L 21/6838; H01L 21/67144; H01L 21/67721
See application file for complete search history.

(56) References Cited

U.S. PATENT DOCUMENTS

| | | | |
|---|---|---|---|
| 9,079,318 B2 | 7/2015 | Groeninger et al. | |
| 9,266,686 B2 | 2/2016 | Schilp et al. | |
| 9,653,338 B2 | 5/2017 | Huang | |
| 9,656,368 B2 | 5/2017 | Kim et al. | |
| 2002/0140148 A1 | 10/2002 | Aigner et al. | |

(Continued)

FOREIGN PATENT DOCUMENTS

| | | | |
|---|---|---|---|
| JP | 4943303 B2 | 5/2012 | |
| JP | 6135626 B2 | 5/2017 | |

(Continued)

*Primary Examiner* — Jason L Vaughan
*Assistant Examiner* — Amanda Kreiling
(74) *Attorney, Agent, or Firm* — Muir Patent Law, PLLC

(57) ABSTRACT

A non-contact type gripper may include a gripping plate, a plurality of blowing holes, a plurality of suction holes and a cavity. The blowing holes may be formed at the gripping plate to inject a gas to an object. The suction holes may be formed at the gripping plate to suck the gas. The cavity may be extended from at least one of the blowing holes to suppress a pressure drop of the gas. The gas flowing through the cavities extended from the corner suction hole and the blowing holes between the adjacent suction holes may receive a low flow resistance. Thus, a pressure drop of the gas injected from the blowing holes may be suppressed by the cavities to maintain a pressure of the gas, thereby preventing a deflection of the corner portion of the object such as the semiconductor chip by a strong suction force. As a result, the non-contact type gripper may grip the object in the non-contact manner to prevent a contamination of the object.

20 Claims, 14 Drawing Sheets

(56) References Cited

U.S. PATENT DOCUMENTS

| | | | |
|---|---|---|---|
| 2009/0175705 A1* | 7/2009 | Nakao | H01L 21/68707 |
| | | | 269/21 |
| 2012/0274011 A1 | 11/2012 | Schilp et al. | |
| 2022/0139755 A1 | 5/2022 | Takada et al. | |

FOREIGN PATENT DOCUMENTS

| | | |
|---|---|---|
| KR | 101600382 B1 | 3/2016 |
| KR | 101759357 B1 | 7/2017 |
| KR | 102179365 B1 | 11/2020 |
| KR | 102377825 B1 | 3/2022 |
| KR | 1020220058354 A | 5/2022 |

* cited by examiner

WITHOUT CAVITY

WITH CAVITY

WITHOUT CAVITY

WITH CAVITY

WITHOUT CAVITY

WITH CAVITY

WITHOUT CAVITY

WITH CAVITY

NON-CONTACT TYPE GRIPPER

CROSS-RELATED APPLICATION

This application claims priority under 35 USC § 119 to Korean Patent Application No. 10-2022-0142087, filed on Oct. 31, 2022 in the Korean Intellectual Property Office (KIPO), the contents of which are herein incorporated by reference in their entirety.

BACKGROUND

1. Field

Example embodiments relate to a non-contact type gripper. More particularly, example embodiments relate to a gripper gripping a semiconductor chip in a non-contact type.

2. Description of the Related Art

Process for bonding a semiconductor chip to a wafer may include a hybrid bonding process. The hybrid bonding process may not use an adhesive. It may be desirable to reduce a surface contamination of the semiconductor chip processed by plasma. Thus, a gripper may serve to transfer the semiconductor chip with a film to a bonding head, and may have a non-contact type structure that may enable to transfer the semiconductor chip to a bonding head without contact. The non-contact type gripper may inject a gas to the semiconductor chip and may suck the injected gas to grip the semiconductor chip in the non-contact manner.

According to related arts, as a thickness of the semiconductor chip may have been decreased, a deflection of a corner portion of the semiconductor chip may occur. The deflected corner portion of the semiconductor chip may contact the non-contact type gripper. This contact may cause the semiconductor chip to be contaminated.

SUMMARY

Example embodiments provide a non-contact type gripper that may be capable of preventing a deflection of a corner portion of an object such as a semiconductor chip.

According to example embodiments, a non-contact type gripper includes a gripping plate, a plurality of blowing holes formed at the gripping plate to inject a gas to an object, a plurality of suction holes formed at the gripping plate to suck the gas, and a first cavity extended from a first blowing hole of the plurality of blowing holes to suppress a pressure drop of the gas.

According to example embodiments, a non-contact type gripper include a gripping plate, a plurality of blowing holes formed at the gripping plate to inject a gas to a semiconductor chip, wherein the plurality of blowing holes are spaced apart from each other by a uniform gap, a plurality of suction holes formed at the gripping plate, wherein each blowing hole of the plurality of blowing holes is disposed in a space between corresponding two adjacent suction holes of the plurality of suction holes, and wherein the plurality of suction holes include a plurality of corner suction holes that are disposed at a plurality of corner regions of the gripping plate, respectively, and a plurality of corner cavities, wherein each corner cavity of the plurality of corner cavities is extended from a corresponding blowing hole of the plurality of blowing holes, wherein the corresponding blowing hole is positioned between a corresponding corner suction hole among the plurality of corner suction holes and a suction hole, adjacent to the corresponding corner suction hole, of the plurality of suction holes.

According to example embodiments, a non-contact type gripper includes a gripping plate, a plurality of blowing holes formed at the gripping plate to inject a gas to a semiconductor chip, wherein the plurality of blowing holes are spaced apart from each other by a uniform gap, a plurality of suction holes formed at the gripping plate, wherein each blowing hole of the plurality of blowing holes is disposed in a space between corresponding two adjacent suction holes of the plurality of suction holes, and wherein the plurality of suction holes include a plurality of corner suction holes that are disposed at a plurality of corner regions of the gripping plate, respectively, a plurality of corner cavities, wherein each corner cavity of the plurality of corner cavities is extended from a corresponding blowing hole of the plurality of blowing holes, wherein the corresponding blowing hole is positioned in a space between a corresponding corner suction hole among the plurality of corner suction holes and a suction hole, adjacent to the corresponding corner suction hole, of the plurality of suction holes, a plurality of edge cavities arranged along a side surface of the gripping plate, wherein the plurality of suction holes further include a plurality of edge suction holes that are arranged along the side surface of the gripping plate, wherein the plurality of blowing holes further include a plurality of edge blowing holes that are arranged along the side surface of the gripping plate, wherein each edge blowing hole of the plurality of edge blowing holes is disposed in a space between corresponding two adjacent edge suction holes of the plurality of edge suction holes, and wherein each edge cavity of the plurality of edge cavities is extended from a corresponding edge blowing hole of the plurality of edge blowing holes, and a plurality of center cavities extended from a plurality of center blowing holes, respectively, wherein the plurality of blowing holes include the plurality of center blowing holes at a central portion of the gripping plate.

According to example embodiments, the gas flowing through the cavities extended from the corner suction hole and the blowing holes between the adjacent suction holes may receive a low flow resistance. Thus, a pressure drop of the gas injected from the blowing holes may be suppressed by the cavities to maintain a pressure of the gas, thereby preventing a deflection of the corner portion of the object such as the semiconductor chip by a strong suction force. As a result, the non-contact type gripper may grip the object in the non-contact manner to prevent a contamination of the object.

BRIEF DESCRIPTION OF THE DRAWINGS

Example embodiments will be more clearly understood from the following detailed description taken in conjunction with the accompanying drawings.

FIG. 1 is a perspective view illustrating a non-contact type gripper in accordance with example embodiments;

FIG. 2 is a cross-sectional view taken along line A-A' in FIG. 1;

FIG. 3 is a cross-sectional view taken along line B-B' in FIG. 1;

FIG. 4 is an enlarged plan view illustrating a gripping plate of the non-contact type gripper in FIG. 1;

FIG. 5 is an enlarged plan view of portion "C" in FIG. 4;

FIG. 6 is an enlarged plan view illustrating a gripping plate of a non-contact type gripper in accordance with example embodiments;

FIG. 7 is an enlarged plan view of portion "D" in FIG. 6;

FIG. 8 is an enlarged plan view illustrating a gripping plate of a non-contact type gripper in accordance with example embodiments;

FIG. 9 is an enlarged plan view of portion "E" in FIG. 8;

FIG. 10 is an enlarged plan view illustrating a gripping plate of a non-contact type gripper in accordance with example embodiments;

FIG. 11 is an enlarged plan view of portion "F" in FIG. 10;

FIG. 12 is an enlarged plan view illustrating a gripping plate of a non-contact type gripper in accordance with example embodiments;

FIG. 13 is an enlarged plan view of portion "G" in FIG. 12;

FIG. 14 is an enlarged plan view illustrating a gripping plate of a non-contact type gripper in accordance with example embodiments;

FIG. 15 is an enlarged plan view of portion "H" in FIG. 14;

FIG. 16 is a view illustrating a speed of a gas around a suction hole without a cavity;

FIG. 17 is a view illustrating a speed of a gas around a suction hole with a cavity;

FIG. 18 is a graph showing a pressure distribution on a bottom surface of a semiconductor chip in accordance with a cavity;

FIG. 19 is a view illustrating a pressure field at a corner portion of a semiconductor chip by a suction hole without a cavity;

FIG. 20 is a view illustrating a pressure field at a corner portion of a semiconductor chip by a suction hole with a cavity;

FIG. 21 is a view illustrating a displacement of a semiconductor chip by a suction hole without a cavity;

FIG. 22 is a view illustrating a displacement of a semiconductor chip by a suction hole with a cavity;

FIG. 23 is a view illustrating a floating height of a semiconductor chip by a suction hole without a cavity;

FIG. 24 is a view illustrating a floating height of a semiconductor chip by a suction hole with a cavity;

FIG. 25 is a plan view illustrating a non-contact type gripper applied to a PLP for a display device in accordance with example embodiments; and FIG. 26 is a cross-sectional view illustrating the non-contact type gripper in FIG. 25.

DETAILED DESCRIPTION OF THE EMBODIMENTS

Hereinafter, example embodiments will be explained in detail with reference to the accompanying drawings.

Figure 1:
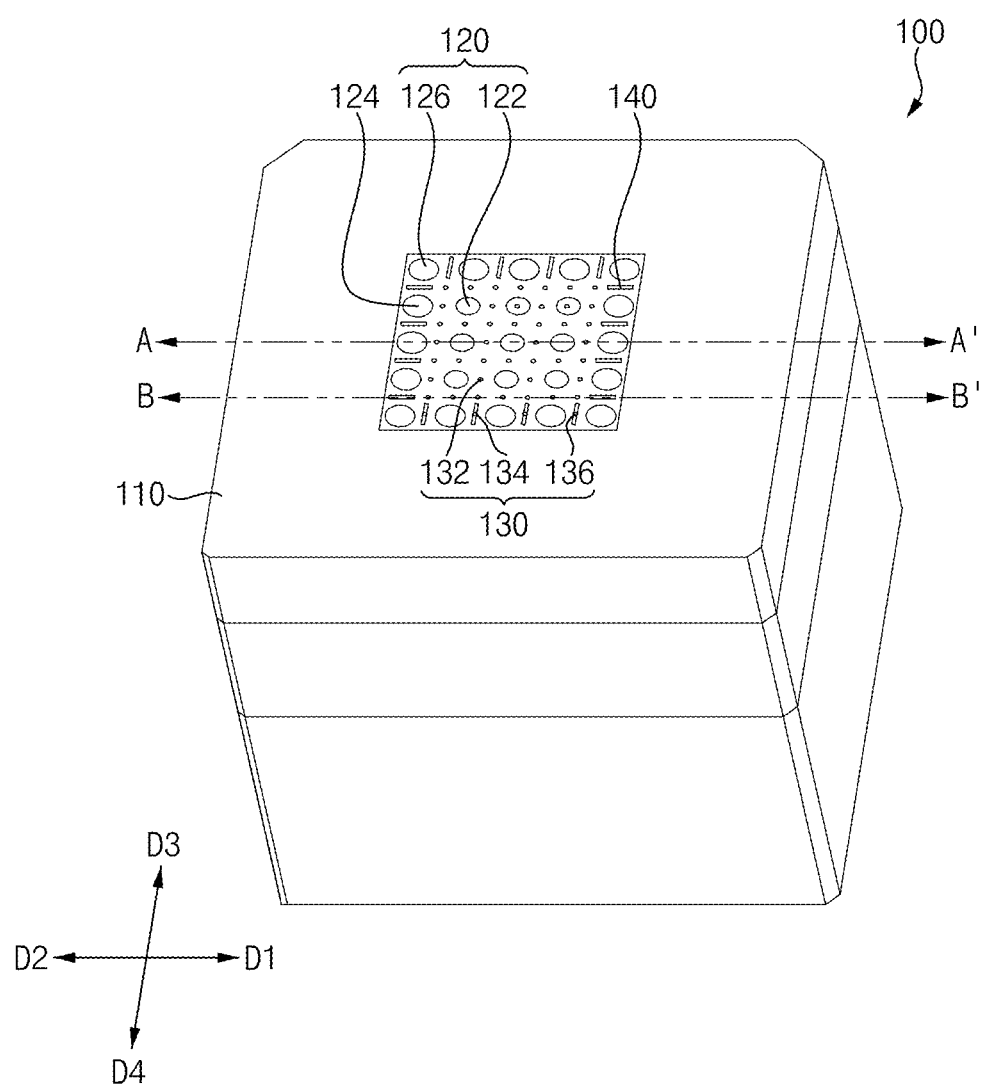
FIGS. 1 to 26 represent non-limiting, example embodiments as described herein.
Figure 2:
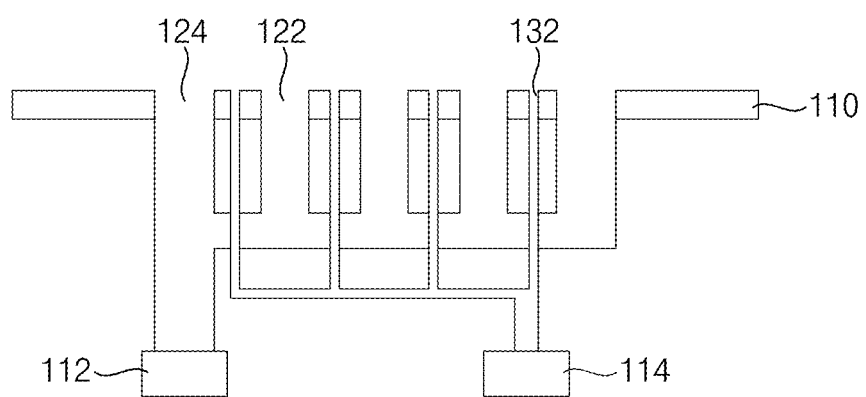
Figure 3:
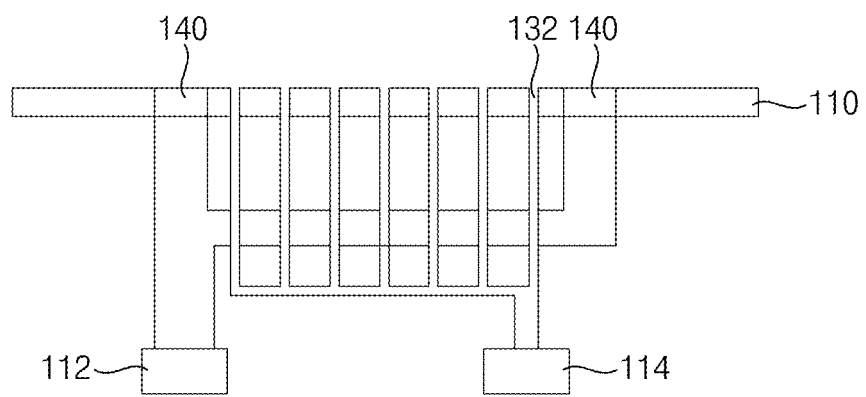
Figure 4:
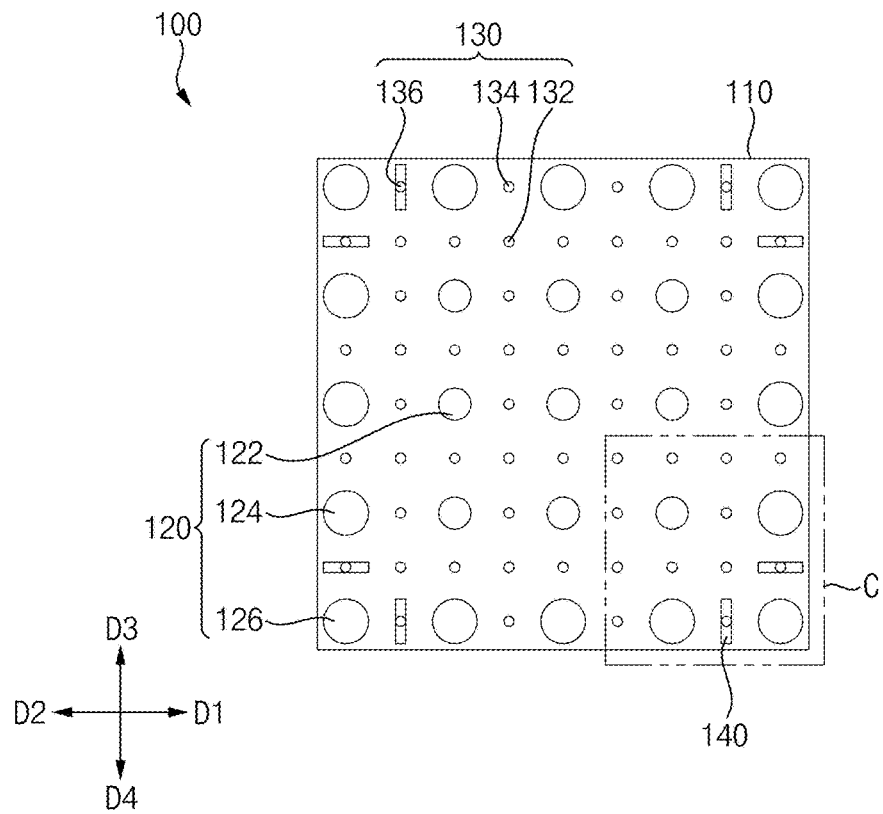
Figure 5:
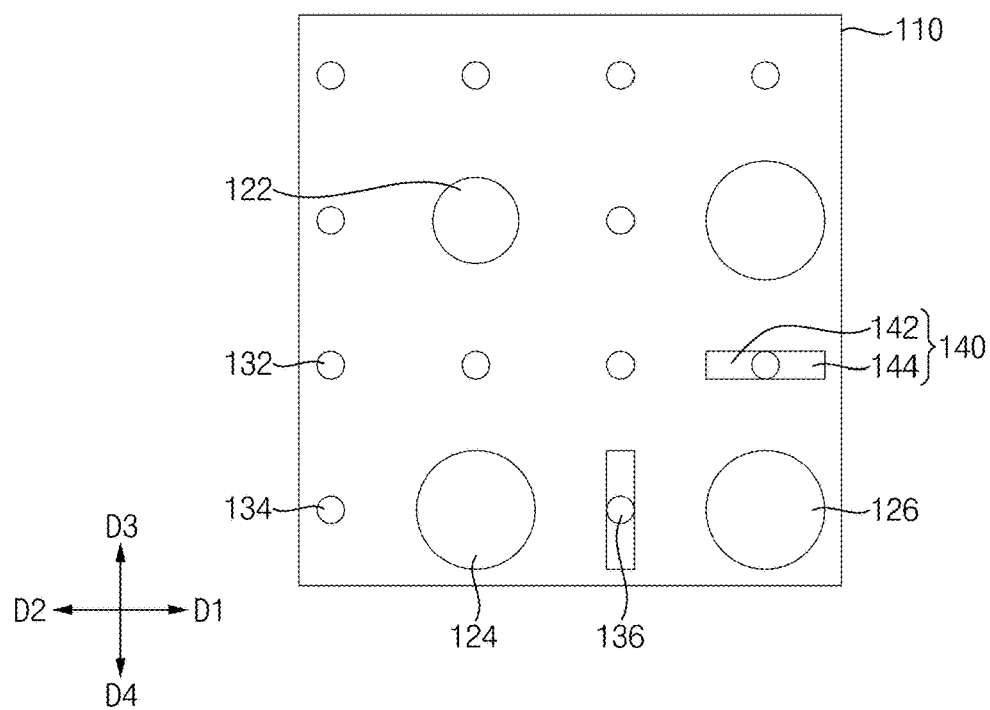

FIG. 1 is a perspective view illustrating a non-contact type gripper in accordance with example embodiments, FIG. 2 is a cross-sectional view taken along line A-A' in FIG. 1, FIG. 3 is a cross-sectional view taken along line B-B' in FIG. 1, FIG. 4 is an enlarged plan view illustrating a gripping plate of the non-contact type gripper in FIG. 1 and FIG. 5 is an enlarged plan view of portion "C" in FIG. 4.

A non-contact type gripper 100 of example embodiments may serve to grip an object in a non-contact type manner. For example, the non-contact type gripper 100 may be used in a hybrid bonding process for manufacturing a semiconductor package. The hybrid bonding process may include thermal compressing a semiconductor chip separated from a film to a wafer using a bond head. The non-contact type gripper 100 may transfer the semiconductor chip to the bond head. However, the non-contact type gripper 100 may be applied to various other parts, not limited within the semiconductor chip.

Referring to FIGS. 1 to 5, the non-contact type gripper 100 may include a gripping plate 110, a plurality of blowing holes 130, a plurality of suction holes 120 and a cavity.

The gripping plate 110 may have a rectangular cross-sectional shape. The gripping plate 110 may be positioned adjacent to the semiconductor chip to grip the semiconductor chip in the non-contact type manner. In some embodiments, an upper surface of the gripping plate 100 may have a planar shape similar to a planar shape of the semiconductor chip that is picked up by the non-contact type gripper 100 in a non-contact manner. The gripping plate 110 may include or may be formed of plastic or metal.

The blowing holes 130 may extend through the gripping plate 110 in a vertical direction. In some embodiments, the vertical direction may be parallel to a normal direction of an upper surface of the gripping plate 110. A blower 112 may be connected to the blowing holes 130. The blower 112 may supply a gas to the blowing holes 130. Thus, the blowing holes 130 may inject the gas to the semiconductor chip to lift up the semiconductor chip from the gripping plate 110. That is, the blowing holes 130 may apply a positive pressure to the semiconductor chip.

In example embodiments, the blowing holes 130 may be spaced apart from each other by a uniform gap. That is, the gap between the blowing holes 130 may be equal to each other. The present invention, however, is not limited thereto.

The suction holes 120 may extend through the gripping plate 110 in the vertical direction. The suction holes 120 may be connected to a vacuum pump 114. The vacuum pump 114 may supply vacuum to the suction holes 120. Thus, the suction holes 120 may suck the gas injected from the blowing holes 130 to draw the semiconductor chip toward the gripping plate 110. That is, the suction holes 120 may apply a negative pressure to the semiconductor chip.

In example embodiments, the suction holes 120 may be spaced apart from each other by a uniform gap. That is, the gap between the suction holes 120 may be equal to each other. The present invention is not limited thereto. The blowing holes 130 may be positioned between the suction holes 120. For example, a blowing hole 130 may be disposed in a space between corresponding two adjacent suction holes 120 in the first or second directions D1 or D2; a blowing hole 130 may be disposed in a space between corresponding two adjacent suction holes 120 in the third or fourth directions D3 or D4; and a blowing hole 130 may be disposed in a space between corresponding two adjacent suction holes 120 in a diagonal direction of the gripping plate 110 with respect to the first or second directions D1 or D2. Each of the blowing holes 130 may be positioned at a central portion between two corresponding suction holes 120. That is, gaps between any one of the blowing holes 130 and the suction holes 120 adjacent to one blowing hole 130 may be equal to each other. The present invention is not limited thereto. For example, the gaps between the blowing hole 130 and the suction holes 120 adjacent to one blowing hole 130 may be different from each other. Further, each of the suction holes 120 may have a diameter longer than a diameter of each of the blowing holes 130. The present invention is not limited thereto. In some embodiments, each center suction hole 122 may be surrounded by four center blowing holes 132 that are disposed at the same distance from the center suction hole 122. Each edge suction hole 124 may be surrounded by two edge blowing holes 134 and one center blowing hole 132 that are disposed at the same distance from the edge suction hole 124. Each corner suction hole 126 may be surrounded by two corner blowing holes 136 that are disposed at the same distance from the corner suction hole 126. Each suction hole 120 may be surrounded by different numbers of blowing holes 130 depending on a location of the suction hole 120 (e.g., a corner portion, an edge portion or a center portion (i.e., portions other than the corner and edge portions)). In some embodiments, the suction holes 120 are connected to the same vacuum pump 114 and the blowing holes 130 are connected to the same blower 112. Since a center suction hole 122 is adjacent to a smaller number of blowing holes 130 than an edge or center suction hole 124 or 122, the effective negative pressure at the corner portion around the corner suction hole 126 may be larger than the effective negative pressure at the edge portion around the edge suction hole 124 or at the center portion around the center suction hole 122. The effective negative pressure refers to a negative pressure negated by a positive pressure exerted by blowing holes.

The suction holes 120 may include a plurality of center suction holes 122, a plurality of edge suction holes 124 and a plurality of corner suction holes 126. The center suction holes 122 may be formed at a central portion of the gripping plate 110. The edge suction holes 124 may be formed at an edge portion of the gripping plate 110. That is, the edge suction holes 124 may be positioned adjacent to side surfaces of the gripping plate 110. The corner suction holes 126 may be formed at corner portions of the gripping plate 110. In example embodiments, because the gripping plate 110 may have the rectangular shape having four corners, the corner suction holes 126 may also include four holes at the four corner portions of the gripping plate 110.

In example embodiments, each of the edge suction holes 124 may have a diameter substantially the same as a diameter of each of the corner suction holes 126. The present invention is not limited thereto. For example, the diameter of the edge suction hole 124 may be longer or shorter than the diameter of the corner suction hole 126. Further, each of the center suction holes 122 may have a diameter shorter than the diameter of each of the edge suction holes 124. The present invention is not limited thereto. For example, the diameter of the center suction hole 122 may be longer than the diameter of the edge suction hole 124. Terms such as "same," "equal," "planar," or "coplanar," as used herein encompass near identically including variations that may occur, for example, due to manufacturing processes. The term "substantially" may be used herein to emphasize this meaning, unless the context or other statements indicate otherwise.

In example embodiments, the diameters of the edge suction hole 124 and the corner suction hole 126 longer than the diameter of the center suction hole 122 may function as to provide a central portion of the semiconductor chip with a negative pressure stronger than a negative pressure applied to an edge portion of the semiconductor chip. The edge suction hole 124 and the corner suction hole 126 may have a function for preventing the semiconductor chip from being moved at a set position as well as a function for drawing the semiconductor chip toward the gripping plate 110. Because the edge portion and the corner portion of the semiconductor chip may have strength weaker than strength of the central portion of the semiconductor chip, a deflection of the semiconductor chip may be generated by the strong negative pressure applied to the edge portion and the corner portion of the semiconductor chip through the edge suction hole 124 and the corner suction hole 126. Particularly, the deflection of the semiconductor chip may be mainly generated at the corner portion of the semiconductor chip. In some embodiments, the effective negative pressure at the corner portion of the semiconductor chip may be greater than that of the center portion thereof due to the difference in the number of blowing holes 130 per a suction hole 120, and higher effective negative pressure may be applied to the corner portion of the semiconductor chip compared to the center portion, which may deflect the corner portion of the semiconductor chip relative to the center portion thereof. For example, when the semiconductor chip has a uniform hardness or rigidity over the entire portion, the difference in the number of blowing holes 130 per a suction hole 120 depending on a location of the suction hole 120 may cause higher effective negative pressure to apply to the corner portion of the semiconductor chip compared to the center portion thereof, which may deflect the corner portion relative to the center portion.

The blowing holes 130 may include a plurality of center blowing holes 132, a plurality of edge blowing holes 134 and a plurality of corner blowing holes 136. The center blowing holes 132 may be positioned between the center suction holes 122. Thus, one center suction hole 122 may be surrounded by the eight center blowing holes 132. The present invention is not limited thereto. The edge blowing holes 134 may be positioned between the edge suction holes 124. Thus, one edge suction hole 124 may be surrounded by the two edge blowing holes 134. The present invention is not limited thereto. The corner blowing holes 136 may be positioned between the corner suction hole 126 and the edge suction holes 124 adjacent to the corner suction hole 126. Thus, one corner suction hole 126 may be surrounded by the two edge blowing holes 134 and the one center blowing hole 132. The present invention is not limited thereto.

The cavity may be formed at a surface of the gripping plate 110. The surface of the gripping plate may be adjacent to or may be oriented toward the semiconductor chip. The cavity may be extended from each of the blowing holes 130. Although the cavity may have an opened upper surface, the semiconductor chip may be located adjacent to the gripping plate by the negative pressure supplied through the suction holes 120 so that the semiconductor chip may partially block the opened upper surface of the cavity. Thus, the gas injected from the blowing holes 130 may flow through the cavity. The gas flowing through the cavity may receive a low flow resistance, and thus the cavity through which the gas flows may suppress a pressure drop of the gas injected from the blowing holes 130. As a result, a strong pressure of the gas may be applied to the corner portion of the semiconductor chip to suppress the deflection of the semiconductor chip. In some embodiments, the cavity extended from a corresponding corner blowing hole 136 may increase a blowing area of the corresponding blowing hole 130, and thus may exert more forces to the semiconductor chip so that the net effect negative pressure around a suction hole adjacent to the cavity may be similar to the net effective negative pressure around a center suction hole 122 or an edge suction hole 124, which may prevent the corner portion around the corner suction hole 126 from deflecting relative to the center portion around the center suction hole 122. In some embodiments, the blower 112 may have a blowing power such that a corner blowing hole 136 with the cavity may have the same blowing force as a corner blowing hole without the cavity. In other words, the addition of the cavity to the corner blowing hole 136 may not lower the blowing force generated by the corner blowing hole 136.

As mentioned above, because the corner portion of the semiconductor chip may have the weak strength, the cavity may include a plurality of corner cavities 140. The corner cavities 140 may be extended from the two corner blowing holes 136 adjacent to the corner suction hole 126.

The corner cavity 140, which may be formed at the corner blowing hole 136 that is adjacent to the corner suction hole 126, may be extended in opposite directions. For example, the corner cavity 140 may be extended in a first direction D1 and a second direction D2 opposite to the first direction D1. Further, the corner cavity 140 may have a straight shape (i.e., may extend along a straight line extending in the first or second directions D1 or D2). The present invention is not limited thereto. That is, the corner cavity 140 may include a first corner cavity 142 and a second corner cavity 144. The first corner cavity 142 may be extended in the first direction D1 toward the adjacent center blowing hole 132. The second corner cavity 144 may be extended in the second direction D2 toward the side surface of the gripping plate 110. The first corner cavity 142 extended in the first direction D1 and the second corner cavity 144 extended in the second direction D2 may have substantially the same length. The present invention is not limited thereto. Further, the first corner cavity 142 extended in the first direction D1 and the second corner cavity 144 extended in the second direction D2 may have a width substantially the same as the diameter of the corner blowing hole 136. The present invention is not limited thereto. For example, the width of the first corner cavity 142 extended in the first direction D1 and the second corner cavity 144 extended in the second direction D2 may be greater or less than the diameter of the corner blowing hole 136. The length and the width of the first corner cavity 142 extended in the first direction D1 and the second corner cavity 144 extended in the second direction D2 may be changed in accordance with a thickness of the semiconductor chip.

The corner cavity 140, which may be formed at the corner blowing hole 136 left the corner suction hole 126, may be extended in opposite directions. For example, the corner cavity 140 may be extended in a third direction D3 and a fourth direction D4 opposite to the third direction D3. The third and fourth directions D3 and D4 may be substantially perpendicular to the first and second directions D1 and D2. Further, the corner cavity 140 may have a straight shape. The present invention is not limited thereto. That is, the corner cavity 140 may include a first corner cavity 142 and a second corner cavity 144. The first corner cavity 142 may be extended in the third direction D3 toward the adjacent blowing hole 130. The second corner cavity 144 may be extended in the fourth direction D4 toward the side surface of the gripping plate 110. The first corner cavity 142 extended in the third direction D3 and the second corner cavity 144 extended in the fourth direction D4 may have substantially the same length. The present invention is not limited thereto. Further, the first corner cavity 142 extended in the third direction D3 and the second corner cavity 144 extended in the fourth direction D4 may have a width substantially the same as the diameter of the corner blowing hole 136. The present invention is not limited thereto. For example, the width of the first corner cavity 142 extended in the third direction D3 and the second corner cavity 144 extended in the fourth direction D4 may be greater or less than the diameter of the corner blowing hole 136. The length and the width of the first corner cavity 142 extended in the third direction D3 and the second corner cavity 144 extended in the fourth direction D4 may be changed in accordance with a thickness of the semiconductor chip.

The gas injected from the corner blowing holes 136 may flow through the corner cavities 140. Thus, the gas flowing through the corner cavities 140 may receive the low flow resistance to suppress the pressure drop of the gas injected from the corner blowing holes 136 by the corner cavities 140. As a result, the strong pressure of the gas may be applied to the corner portion of the semiconductor chip to suppress the deflection of the corner portion of the semiconductor chip.

Figure 6:
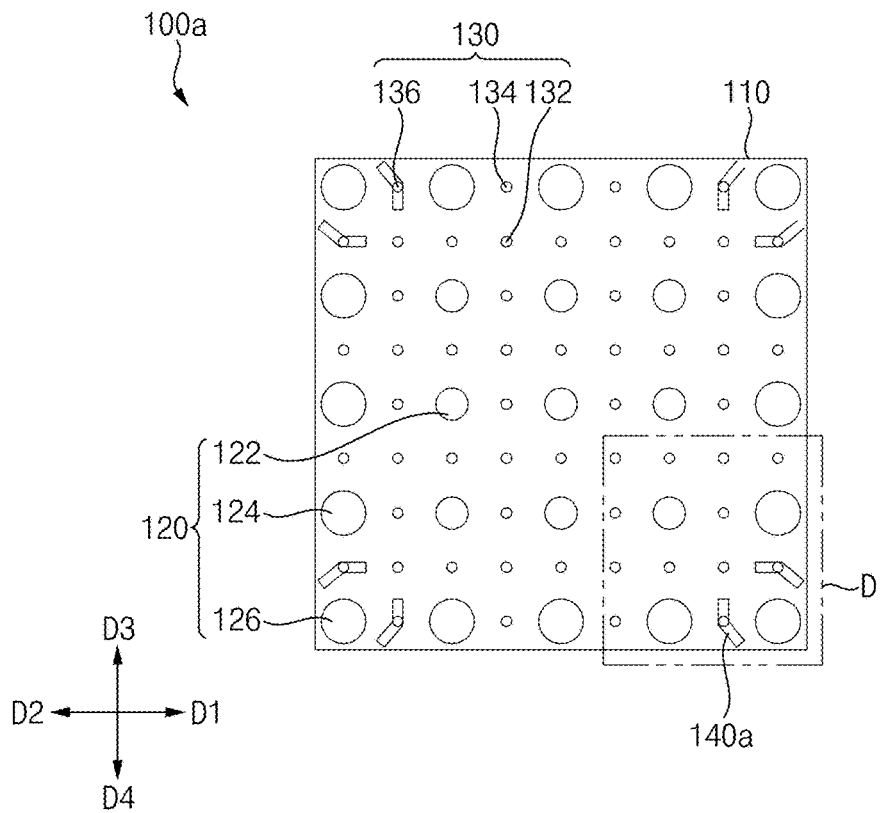
Figure 7:
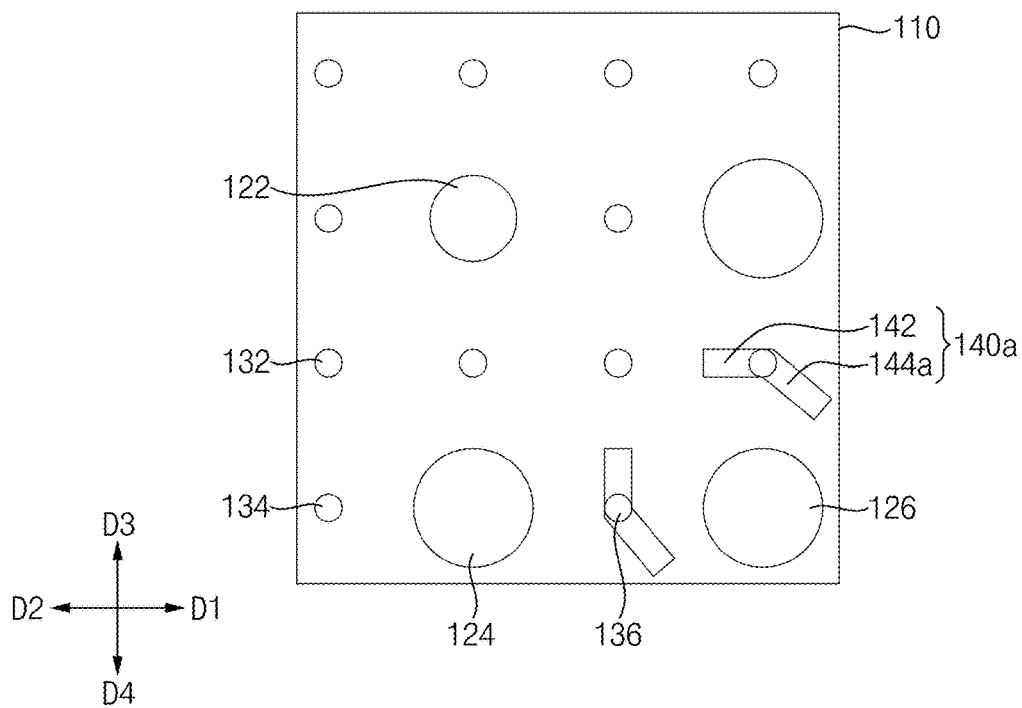

FIG. 6 is an enlarged plan view illustrating a gripping plate of a non-contact type gripper in accordance with example embodiments and FIG. 7 is an enlarged plan view of portion "D" in FIG. 6.

A non-contact type gripper 100a of example embodiments may include elements substantially the same as those of the non-contact type gripper 100 in FIG. 4 except for a corner cavity. Thus, the same reference numerals may refer to the same elements and any further illustrations with respect to the same elements may be omitted herein for brevity.

Referring to FIGS. 6 and 7, each of corner cavities 140a of example embodiments may include a first corner cavity 142 and a second corner cavity 144a. The first corner cavity 142 may be substantially the same as the first corner cavity 142 in FIG. 4. Thus, any further illustrations with respect to the first corner cavity 142 may be omitted herein for brevity.

The second corner cavity 144a may be slantly extended with respect to the first direction D1 or the fourth direction D4. Particularly, the second corner cavity 144a may be extended toward the corner suction hole 126. Thus, an obtuse angle may be formed between the first corner cavity 142 and the second corner cavity 144a.

When the second corner cavity 144a may be adjacent to the corner suction hole 126, the negative pressure applied to the corner portion of the semiconductor chip from the corner suction hole 126 may be weakened by the positive pressure by the second corner cavity 144a. Although the semiconductor chip may be slightly misaligned by the negative pressure drop, a strong pressure of the gas flowing through the second corner cavity 144a may be applied to the corner portion of the semiconductor chip to more suppress the deflection of the semiconductor chip.

Figure 8:
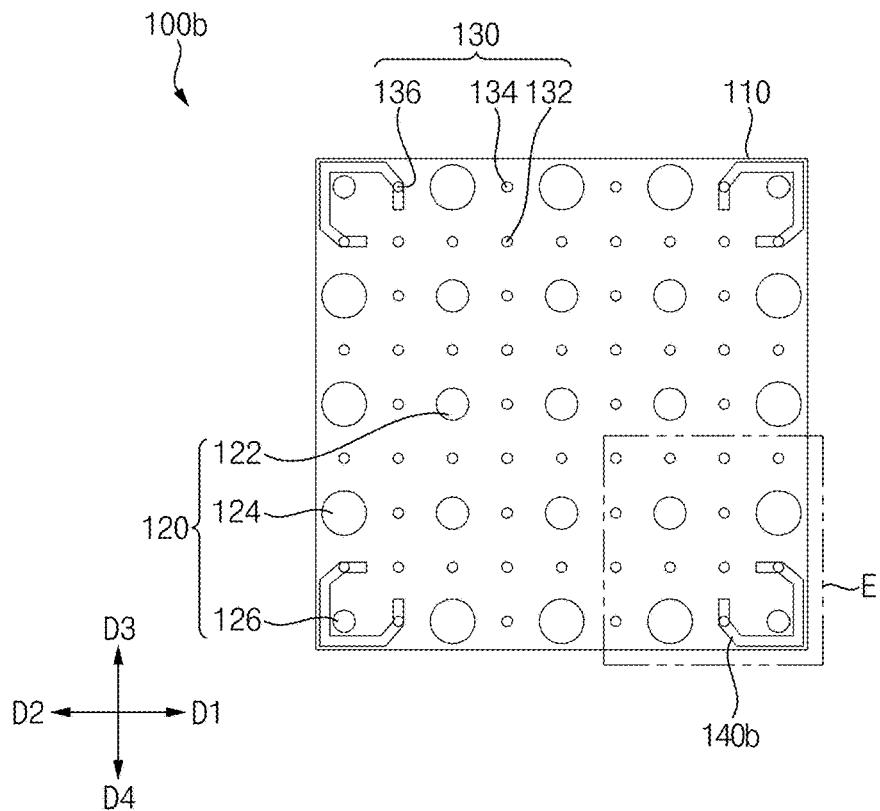
Figure 9:
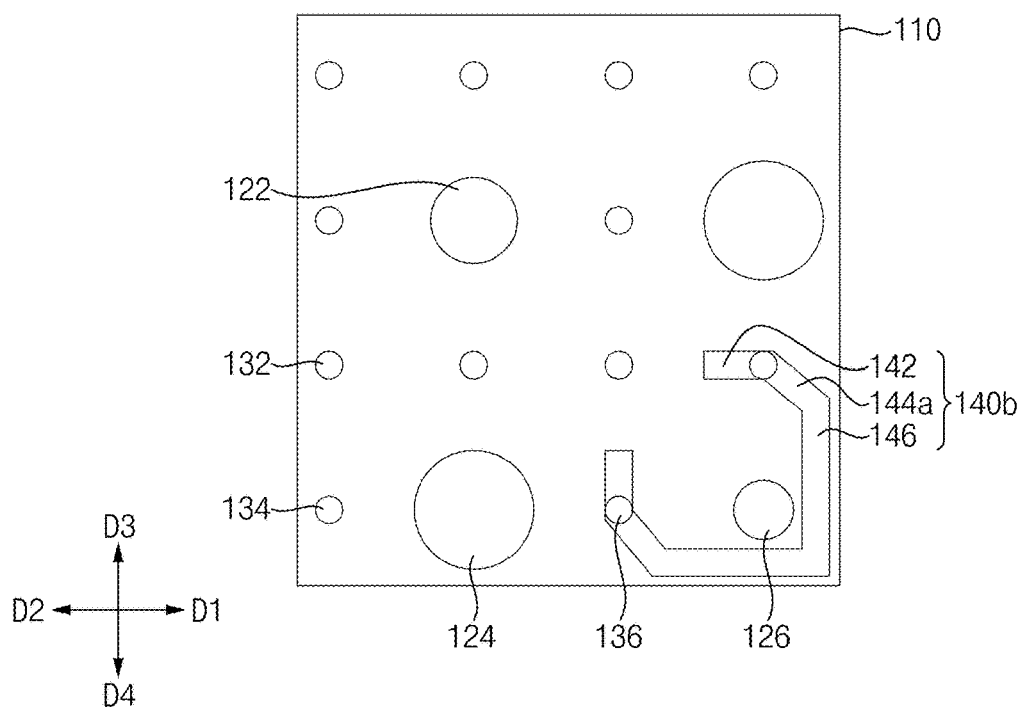

FIG. 8 is an enlarged plan view illustrating a gripping plate of a non-contact type gripper in accordance with example embodiments and FIG. 9 is an enlarged plan view of portion "E" in FIG. 8.

A non-contact type gripper 100b of example embodiments may include elements substantially the same as those of the non-contact type gripper 100a in FIG. 6 except for further including a connection cavity. Thus, the same reference numerals may refer to the same elements and any further illustrations with respect to the same elements may be omitted herein for brevity.

Referring to FIGS. 8 and 9, each of corner cavities 140b of example embodiments may further include a connection cavity 146. The connection cavity 146 may be extended from the second corner cavity 144a. Further, the connection cavities 146 extended from the second corner cavities 144a may be connected with each other. Thus, the second corner cavities 144a may be connected with each other through the connection cavity 146.

Therefore, the corner suction hole 126 may be surrounded by the second corner cavities 144a and the connection cavity 146. Thus, the negative pressure applied to the corner portion of the semiconductor chip from the corner suction hole 126 may be more weakened by the positive pressure by the second corner cavities 144a and the connection cavity 146. Although the semiconductor chip may be slightly misaligned with respect to the gripping plate 110 by the negative pressure drop, a strong pressure of the gas flowing through the second corner cavities 144a and the connection cavity 146 may be applied to the corner portion of the semiconductor chip to more suppress the deflection of the semiconductor chip.

Figure 10:
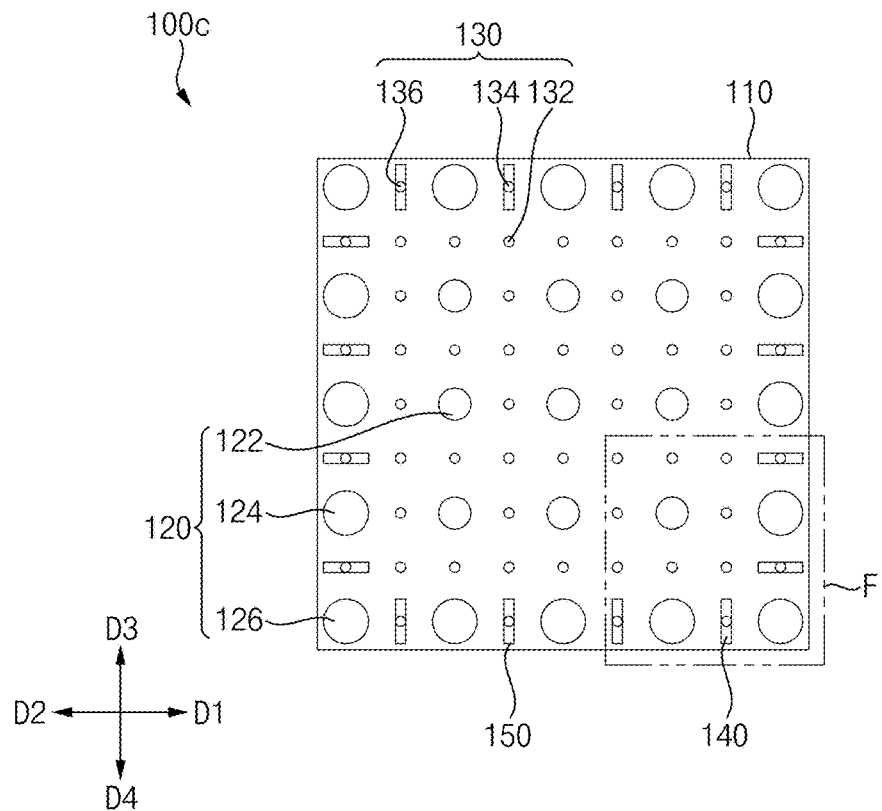
Figure 11:
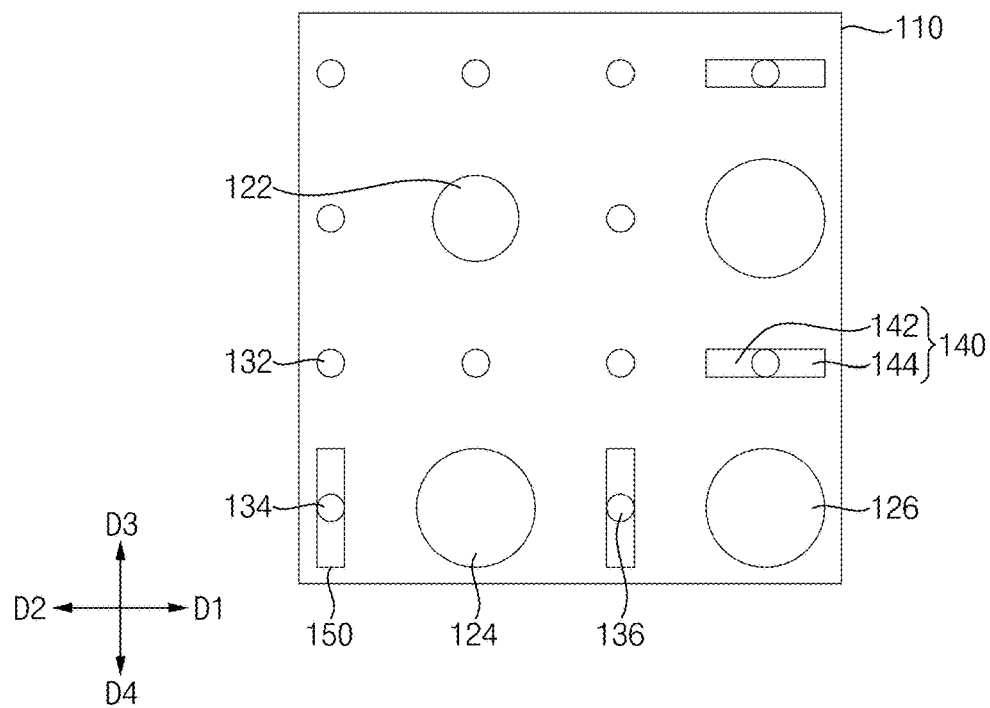

FIG. 10 is an enlarged plan view illustrating a gripping plate of a non-contact type gripper in accordance with example embodiments and FIG. 11 is an enlarged plan view of portion "F" in FIG. 10.

A non-contact type gripper 100c of example embodiments may include elements substantially the same as those of the non-contact type gripper 100 in FIG. 4 except for further including an edge cavity. Thus, the same reference numerals may refer to the same elements and any further illustrations with respect to the same elements may be omitted herein for brevity.

Referring to FIGS. 10 and 11, a cavity of example embodiments may further include edge cavities 150. The edge cavities 150 may be extended from each of the edge blowing holes 134 in opposite directions. The present invention is not limited thereto. Further, the each of the edge cavities 150 may have a linear shape. The present invention is not limited thereto.

As mentioned above, because the strength of the edge portion of the semiconductor chip may be weaker than the strength of the central portion of the semiconductor chip, the pressure of the gas flowing through the edge cavities 150 may be maintained so that the maintained pressure of the gas may be applied to the edge portion of the semiconductor chip. As a result, the deflection of the edge portion of the semiconductor chip may be suppressed.

Figure 12:
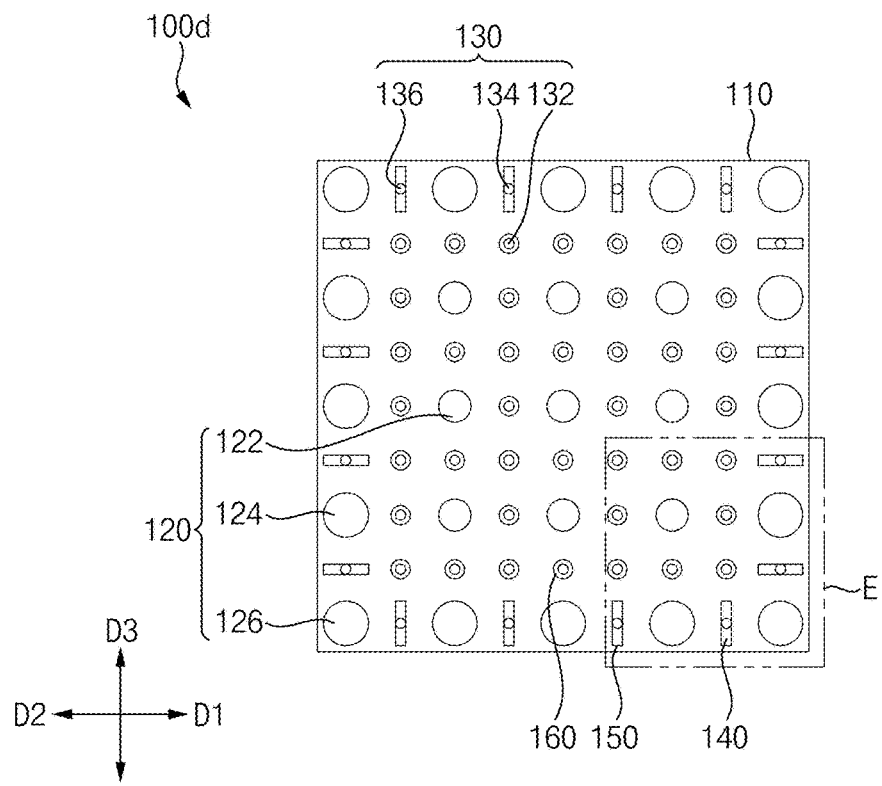
Figure 13:
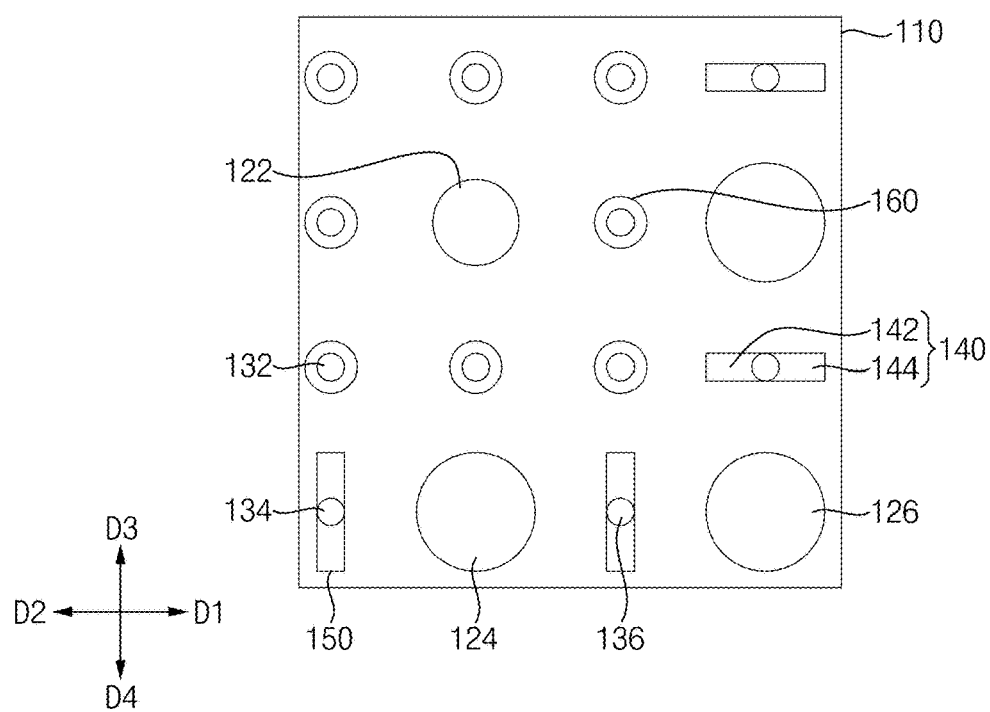

FIG. 12 is an enlarged plan view illustrating a gripping plate of a non-contact type gripper in accordance with example embodiments and FIG. 13 is an enlarged plan view of portion "G" in FIG. 12.

A non-contact type gripper 100d of example embodiments may include elements substantially the same as those of the non-contact type gripper 100c in FIG. 10 except for further including center cavities. Thus, the same reference numerals may refer to the same elements and any further illustrations with respect to the same elements may be omitted herein for brevity.

Referring to FIGS. 12 and 13, a cavity of example embodiments may further include center cavities 160. The center cavities 160 may be extended from each of the center blowing holes 132. Further, the each of the center cavities 160 may have a circular shape. The present invention is not limited thereto. For example, the center cavity 160 may have a triangular shape, a quadrangular shape, etc.

When the semiconductor chip may have a very thin thickness, the deflection may also be generated at the central portion of the semiconductor chip. Thus, the pressure of the gas flowing through the center cavities 160 may be maintained so that the maintained pressure of the gas may be applied to the edge portion of the semiconductor chip. As a result, the deflection of the edge portion of the semiconductor chip may be suppressed.

Figure 14:
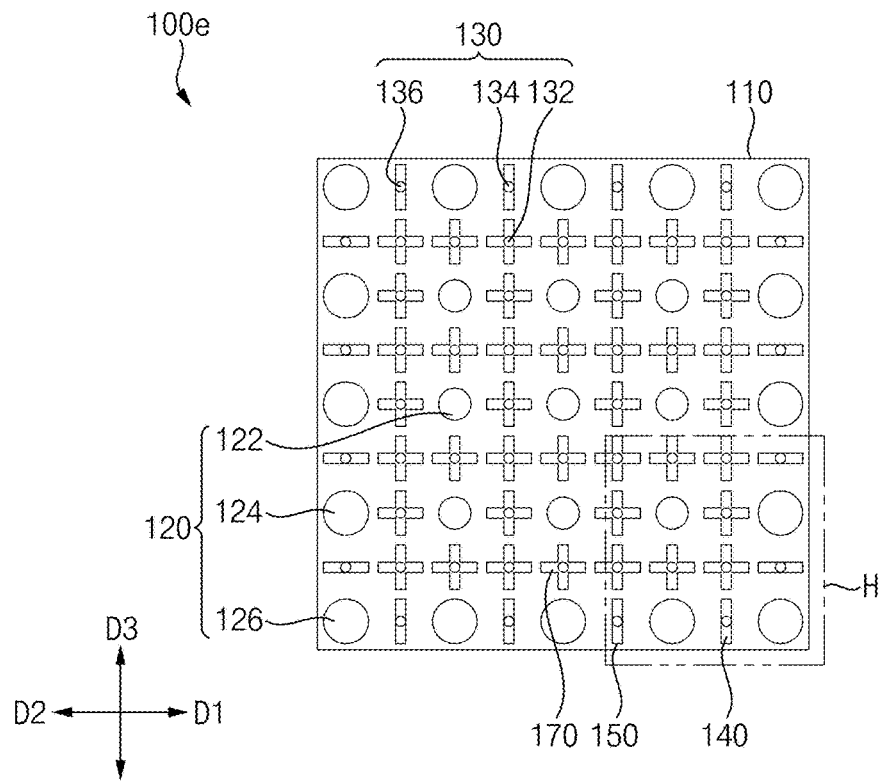
Figure 15:
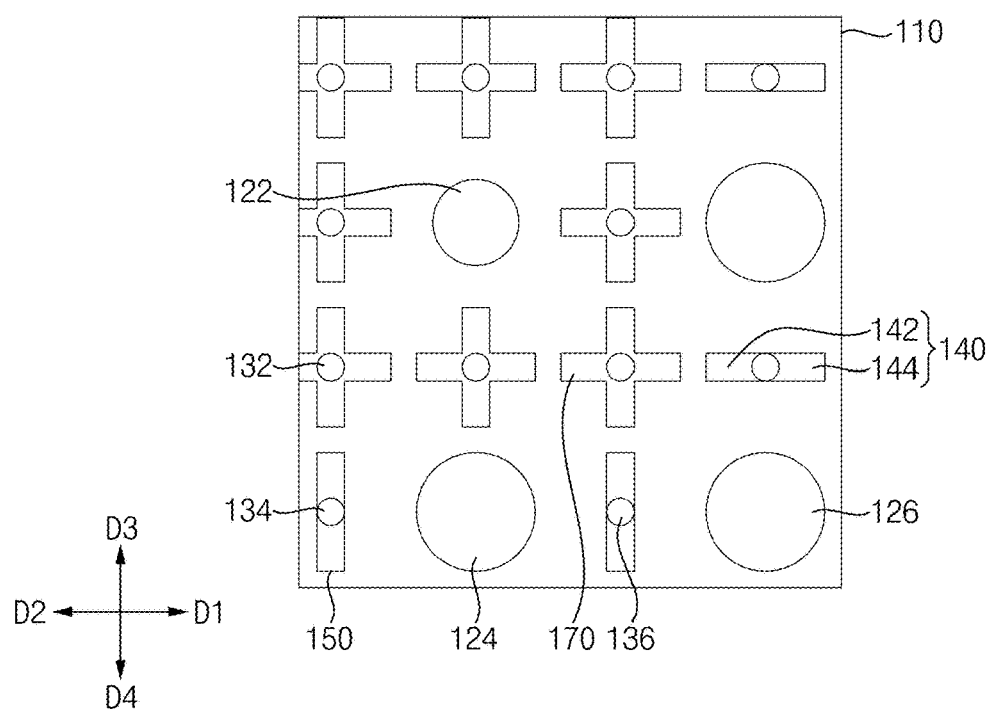

FIG. 14 is an enlarged plan view illustrating a gripping plate of a non-contact type gripper in accordance with example embodiments and FIG. 15 is an enlarged plan view of portion "H" in FIG. 14.

A non-contact type gripper 100e of example embodiments may include elements substantially the same as those of the non-contact type gripper 100d in FIG. 11 except for a shape of a center cavity. Thus, the same reference numerals may refer to the same elements and any further illustrations with respect to the same elements may be omitted herein for brevity.

Referring to FIGS. 14 and 15, a center cavity 170 of example embodiments may have a cross shape. That is, the center cavity 170 may be extended in the first direction D1, the second direction D2, the third direction D3 and the fourth direction D4. The center cavity 170 may have extended lengths substantially equal to or different from each other.

Figure 16:
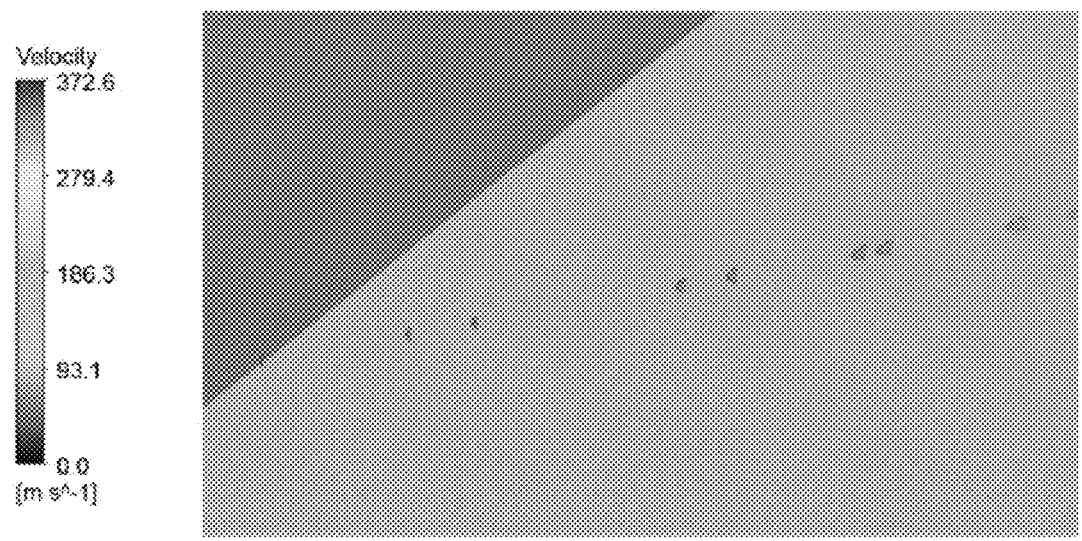
Figure 17:
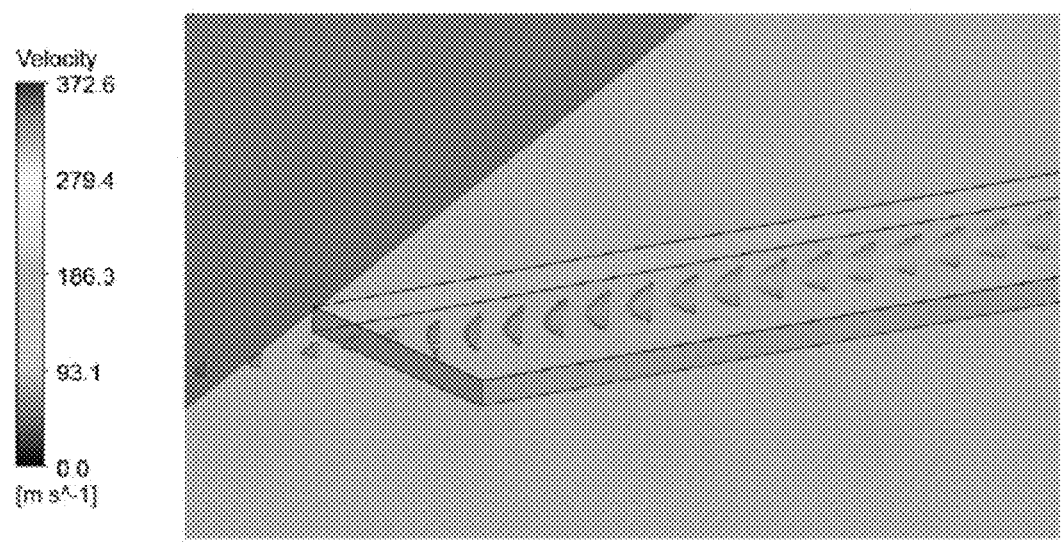

FIG. 16 is a view illustrating a speed of a gas around a suction hole without a cavity and FIG. 17 is a view illustrating a speed of a gas around a suction hole with a cavity.

As shown in FIG. 16, when the non-contact type gripper may not include the cavity, it can be noted that the gas injected through the blowing holes may be rapidly expanded to greatly drop the pressure of the gas.

In contrast, as shown in FIG. 17, when the non-contact type gripper may include the cavity, the gas injected through the blowing holes may be introduced into the cavity. Thus, it can be noted that the expansion of the gas may be suppressed to almost maintain the pressure of the gas.

Figure 18:
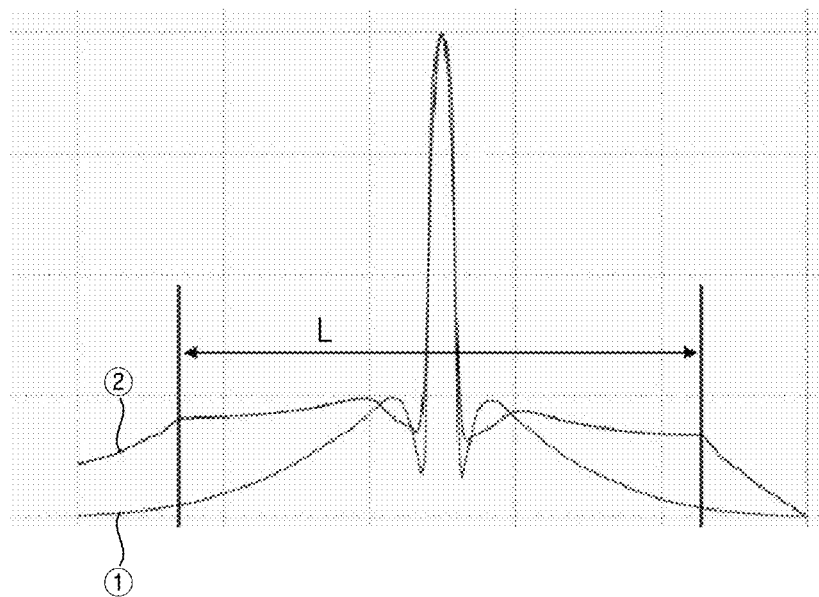

FIG. 18 is a graph showing a pressure distribution on a bottom surface of a semiconductor chip in accordance with a cavity.

In FIG. 18, a horizontal axis may represent positions of the semiconductor chip and a vertical axis may represent pressures. A line ① may represent a pressure applied to the semiconductor chip without the cavity and a line ② may represent a pressure applied to the semiconductor chip with the cavity.

As shown in FIG. 18, it can be noted that a pressure applied to the edge portion of the semiconductor chip with the cavity may be higher than a pressure applied to the edge portion of the semiconductor chip without the cavity. Thus, it can be noted that the pressure of the gas may be maintained by inducing the gas injected through the blowing holes into the cavity.

Figure 19:
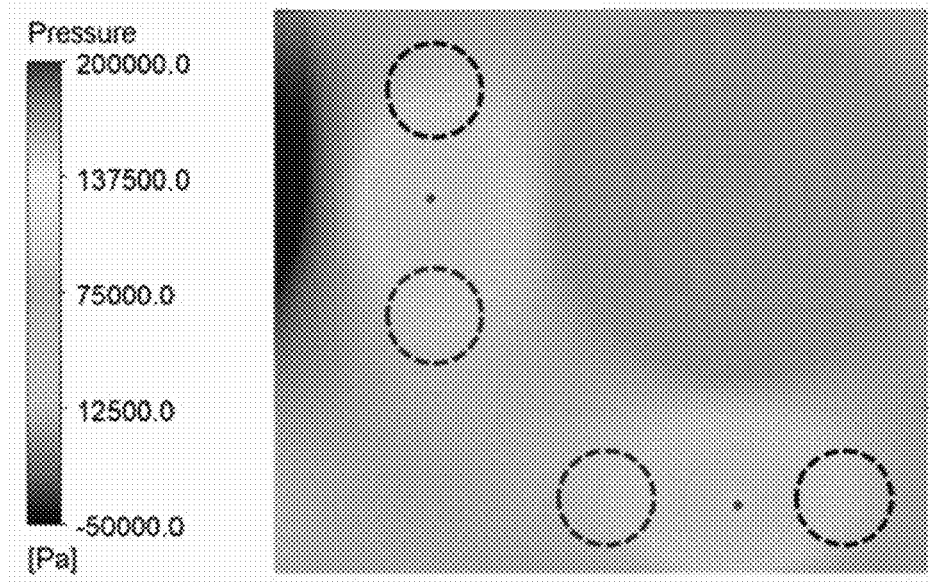
Figure 20:
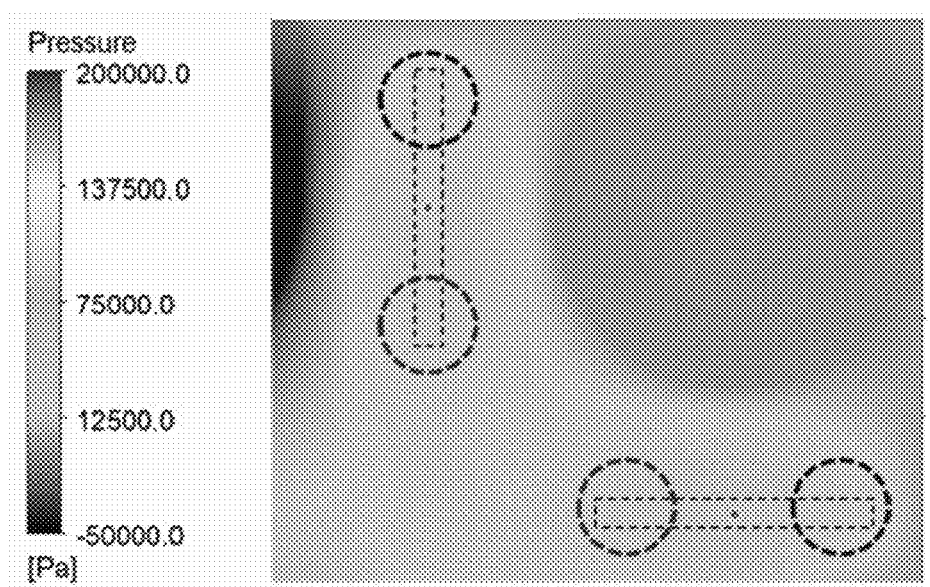

FIG. 19 is a view illustrating a pressure field at a corner portion of a semiconductor chip by a suction hole without a cavity and FIG. 20 is a view illustrating a pressure field at a corner portion of a semiconductor chip by a suction hole with a cavity.

As shown in FIGS. 19 and 20, it can be noted that a pressure applied to the edge portions of the semiconductor chip, which may correspond to ends of the cavity, with the cavity may be higher than a pressure applied to the edge portions of the semiconductor chip without the cavity.

Figure 21:
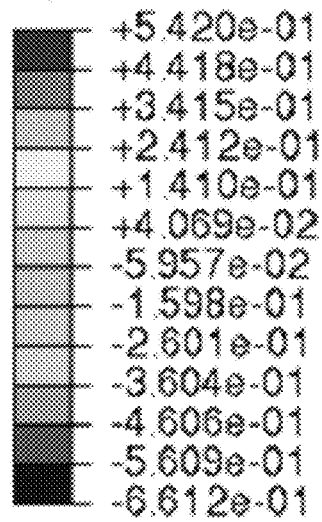
Figure 21:
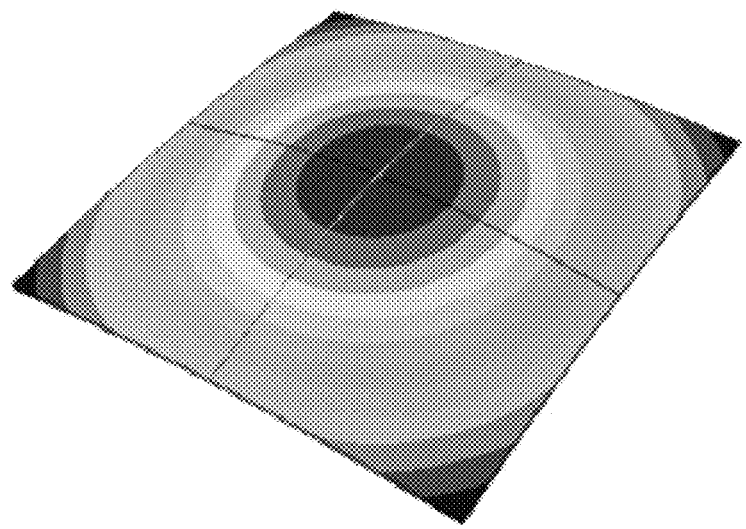
Figure 22:
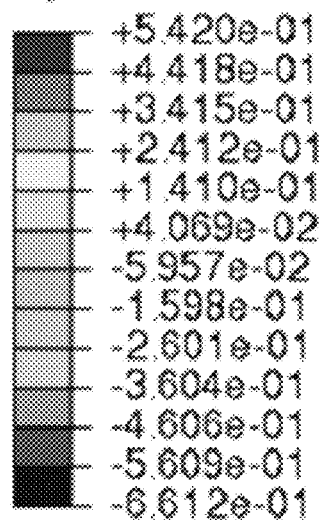
Figure 22:
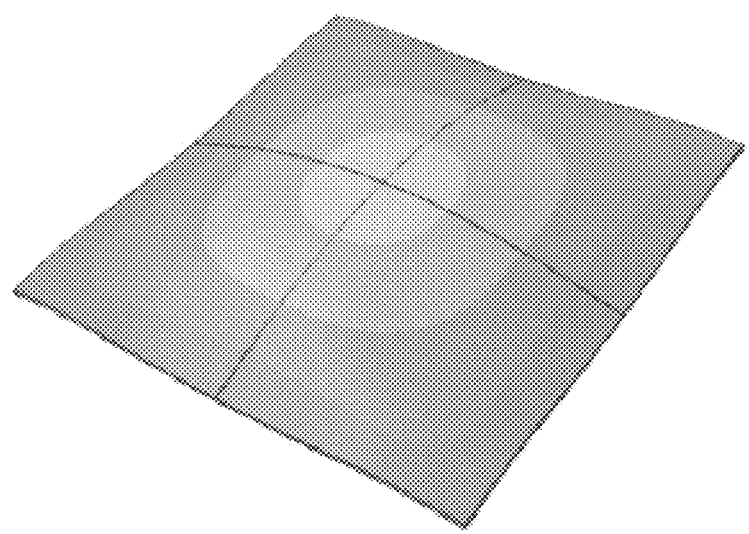

FIG. 21 is a view illustrating a displacement of a semiconductor chip by a suction hole without a cavity and FIG. 22 is a view illustrating a displacement of a semiconductor chip by a suction hole with a cavity.

As shown in FIG. 21, when the non-contact type gripper may not include the cavity, it can be noted that the corner portion of the semiconductor chip may be greatly deformed in a downward direction. That is, it can be noted that the corner portion of the semiconductor chip may be downwardly deflected.

In contrast, as shown in FIG. 22, when the non-contact type gripper may include the cavity, it can be noted that the corner portion of the semiconductor chip may be slightly deformed in the downward direction. That is, it can be noted that the corner portion of the semiconductor chip may be slightly deflected in the downward direction.

Figure 23:
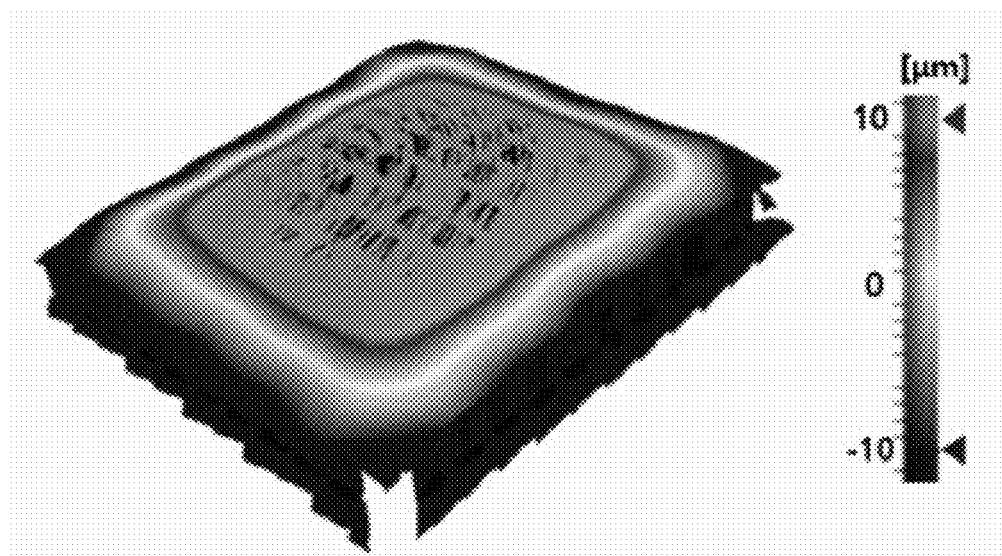
Figure 24:
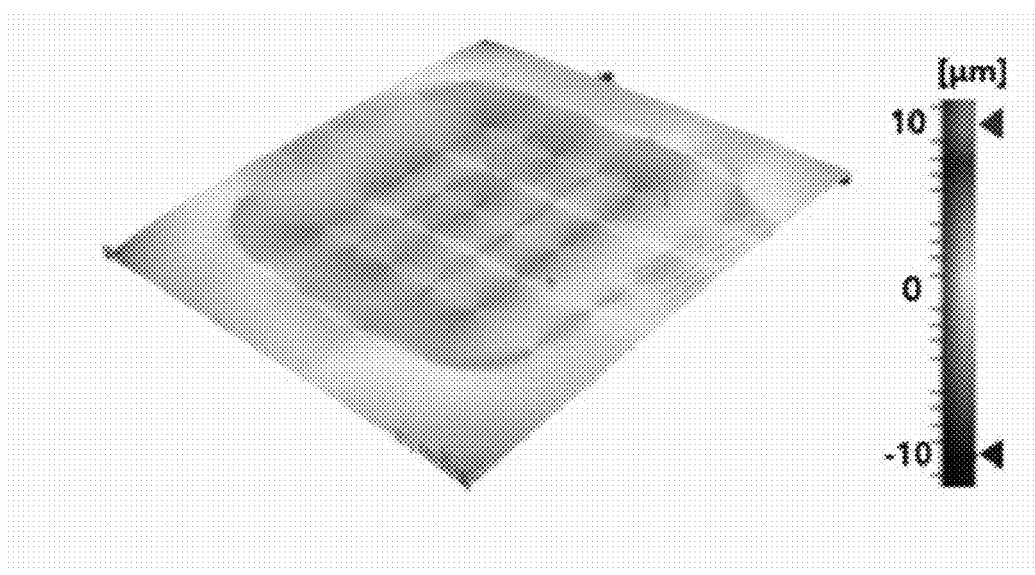

FIG. 23 is a view illustrating a floating height of a semiconductor chip by a suction hole without a cavity and FIG. 24 is a view illustrating a floating height of a semiconductor chip by a suction hole with a cavity.

As shown in FIG. 23, when the non-contact type gripper may not include the cavity, it can be noted that the corner portion of the semiconductor chip may be highly floated in a downward direction. The highly floated corner portion of the semiconductor chip may contact the gripping plate. The term "contact," as used herein, refers to a direct connection (i.e., touching) unless the context indicates otherwise.

In contrast, as shown in FIG. 24, when the non-contact type gripper may include the cavity, it can be noted that the corner portion of the semiconductor chip may be slightly floated in the downward direction. Thus, the slightly floated corner portion of the semiconductor chip may not contact the gripping plate.

Figure 25:
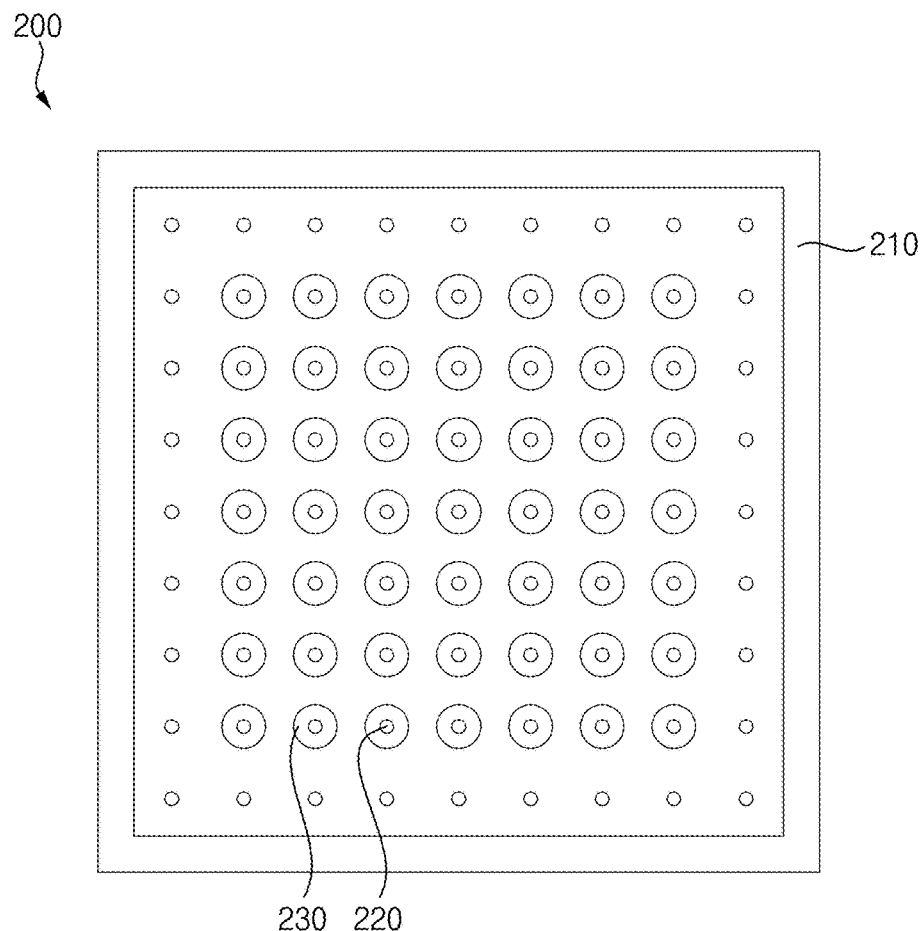
Figure 26:
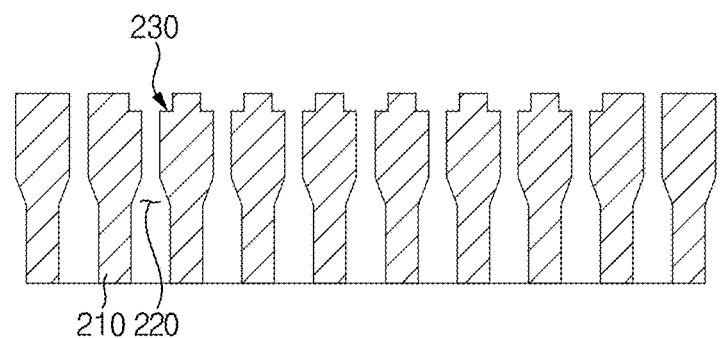

FIG. 25 is a plan view illustrating a non-contact type gripper applied to a panel for a display device in accordance with example embodiments and FIG. 26 is a cross-sectional view illustrating the non-contact type gripper in FIG. 25.

Referring to FIGS. 25 and 26, a non-contact type gripper 200 may be used for gripping a PLP for a display in a non-contact type manner. The non-contact type gripper 200 may include a gripping plate 210, a plurality of blowing holes 220 and a plurality of cavities 230.

The blowing holes 220 may be formed through the gripping plate 210. The blowing holes 220 may be spaced apart from each other by a uniform gap. The cavities 230 may surround each of the blowing holes 220. In example embodiments, each of the cavities 230 may have a circular shape. The present invention is not limited thereto.

The PLP having a thin thickness may be downwardly deflected. The gas in the cavity 230 injected from the blowing holes 220 may support a central portion of the PLP. Thus, the deflection of the central portion of the PLP may be suppressed by the gas in the cavities 230.

According to example embodiments, the gas flowing through the cavities extended from the corner suction hole and the blowing holes between the adjacent suction holes may receive a low flow resistance. Thus, a pressure drop of the gas injected from the blowing holes may be suppressed by the cavities to maintain a pressure of the gas, thereby preventing a deflection of the corner portion of the object such as the semiconductor chip by a strong suction force. As a result, the non-contact type gripper may grip the object in the non-contact manner to prevent a contamination of the object.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-contact type gripper comprising:
a gripping plate;
a plurality of blowing holes formed at the gripping plate to inject a gas to an object;
a plurality of suction holes formed at the gripping plate to suck the gas; and
a first cavity formed at an upper surface of the gripping plate and extended from a first blowing hole of the plurality of blowing holes toward the upper surface of the gripping plate to suppress a pressure drop of the gas.

2. The non-contact type gripper of claim 1,
wherein the first cavity has a linear shape.

3. The non-contact type gripper of claim 2,
wherein the first cavity is extended from the first blowing hole in opposite directions.

4. The non-contact type gripper of claim 1, further comprising:
a second cavity having a circular shape that surrounds a second blowing hole of the plurality of blowing holes,
wherein the first cavity is adjacent to a side of the gripping plate, and is disposed between the side of the gripping plate and the second cavity.

5. The non-contact type gripper of claim 1,
wherein the plurality of suction holes are spaced apart from each other by a uniform gap, and
wherein each blowing hole of the plurality of blowing holes is positioned in a space between corresponding two suction holes of the plurality of suction holes.

6. The non-contact type gripper of claim 5,
wherein the plurality of suction holes include a plurality of corner suction holes that are arranged at a plurality of corner regions of the gripping plate, respectively,
wherein the first cavity comprises a plurality of pair of corner cavities adjacent to the plurality of corner regions of the gripping plate, respectively,
wherein each corner suction hole of the plurality of corner suction holes is disposed at a corresponding corner region that is defined by a corresponding pair of corner cavities of the plurality of pair of corner cavities,
wherein the plurality of blowing holes include a plurality of pair of corner blowing holes, and
wherein each corner cavity of the plurality of pair of corner cavities is extended from a corresponding corner blowing hole of the plurality of pair of corner blowing holes.

7. The non-contact type gripper of claim 6,
wherein each corner cavity of the plurality of pair of corner cavities comprises:
a first corner cavity portion extended in a first direction from the corresponding corner blowing hole toward a side surface of the gripping plate, the side surface of the gripping plate being adjacent to the corresponding corner blowing hole; and
a second corner cavity portion extended from the corresponding corner blowing hole in a second direction opposite to the first direction, and
wherein the first corner cavity portion and the second corner cavity portion are connected with each other through the corresponding corner blowing hole.

8. The non-contact type gripper of claim 7, further comprising:
a connection cavity connecting a first corner cavity portion of one of the plurality of pair of corner cavities to a first corner cavity portion of another corner cavity of the plurality of pair of corner cavities.

9. The non-contact type gripper of claim 6,
wherein each corner cavity of the plurality of pair of corner cavities comprises:
a first corner cavity portion extended in a first direction from the corresponding corner blowing hole toward a side surface of the gripping plate, the first direction forming an obtuse angle with respect to the side surface of the gripping plate and the side surface of the gripping plate being adjacent to the corresponding corner blowing hole; and
a second corner cavity portion extended from the corresponding corner blowing hole in a second direction, the second direction extending away from the side surface of the gripping plate, and
wherein the first corner cavity portion and the second corner cavity portion are connected with each other through the corresponding corner blowing hole.

10. The non-contact type gripper of claim 6,
wherein the first cavity further comprises a plurality of edge cavities that are arranged along a side surface of the gripping plate,
wherein the plurality of suction holes further include a plurality of edge suction holes that are arranged along the side surface of the gripping plate,
wherein the plurality of blowing holes further include a plurality of edge blowing holes that are arranged along the side surface of the gripping plate,
wherein each edge blowing hole of the plurality of edge blowing holes is disposed in a space between corresponding two adjacent edge suction holes of the plurality of edge suction holes, and
wherein each edge cavity of the plurality of edge cavities is extended from a corresponding edge blowing hole of the plurality of edge blowing holes.

11. The non-contact type gripper of claim 1,
wherein the object comprises a semiconductor chip.

12. A non-contact type gripper comprising:
a gripping plate;
a plurality of blowing holes formed at the gripping plate to inject a gas to a semiconductor chip, wherein the plurality of blowing holes are spaced apart from each other by a uniform gap;
a plurality of suction holes formed at the gripping plate, wherein each blowing hole of the plurality of blowing holes is disposed in a space between corresponding two adjacent suction holes of the plurality of suction holes, and wherein the plurality of suction holes include a plurality of corner suction holes that are disposed at a plurality of corner regions of the gripping plate, respectively; and
a plurality of corner cavities, wherein each corner cavity of the plurality of corner cavities is extended from a corresponding blowing hole of the plurality of blowing holes, wherein the corresponding blowing hole is positioned between a corresponding corner suction hole among the plurality of corner suction holes and a suction hole, adjacent to the corresponding corner suction hole, of the plurality of suction holes.

13. The non-contact type gripper of claim 12,
wherein each corner cavity of the plurality of corner cavities comprises:
a first corner cavity portion extended in a first direction from the corresponding blowing hole toward a side surface of the gripping plate, the first direction forming an obtuse angle with respect to the side surface of the gripping plate and the side surface of the gripping plate being adjacent to the corresponding blowing hole; and
a second corner cavity portion extended from the corresponding blowing hole in a second direction, the second direction extending away from the side surface of the gripping plate, and
wherein the first corner cavity portion and the second corner cavity portion are connected with each other through the corresponding blowing hole.

14. The non-contact type gripper of claim 13, further comprising:
a connection cavity connecting a first corner cavity portion of one of the plurality of corner cavities to a first corner cavity portion of another corner cavity of the plurality of corner cavities.

15. The non-contact type gripper of claim 13,
wherein each of the first corner cavity portion and the second corner cavity portion has a linear shape.

16. The non-contact type gripper of claim 12, further comprising:
a plurality of edge cavities that are arranged along a side surface of the gripping plate,
wherein the plurality of suction holes further include a plurality of edge suction holes that are arranged along the side surface of the gripping plate,
wherein the plurality of blowing holes further include a plurality of edge blowing holes that are arranged along the side surface of the gripping plate,
wherein each edge blowing hole of the plurality of edge blowing holes is disposed in a space between corresponding two adjacent edge suction holes of the plurality of edge suction holes, and
wherein each edge cavity of the plurality of edge cavities is extended from a corresponding edge blowing hole of the plurality of edge blowing holes.

17. The non-contact type gripper of claim 16,
wherein each edge of the plurality of edge cavities has a linear shape extended from a corresponding edge blowing hole of the plurality of edge blowing holes in opposite directions.

18. The non-contact type gripper of claim 12, further comprising:
a plurality of center cavities extended from a plurality of center blowing holes, respectively,
wherein the plurality of blowing holes include the plurality of center blowing holes at a central portion of the gripping plate.

19. The non-contact type gripper of claim 18,
wherein each center cavity of the plurality of center cavities has a cross shape extended from a corresponding center blowing hole of the plurality of center blowing holes or a circular shape surrounding the corresponding center blowing hole.

20. A non-contact type gripper comprising:
a gripping plate;
a plurality of blowing holes formed at the gripping plate to inject a gas to a semiconductor chip, wherein the plurality of blowing holes are spaced apart from each other by a uniform gap;
a plurality of suction holes formed at the gripping plate, wherein each blowing hole of the plurality of blowing holes is disposed in a space between corresponding two adjacent suction holes of the plurality of suction holes, and wherein the plurality of suction holes include a plurality of corner suction holes that are disposed at a plurality of corner regions of the gripping plate, respectively;
a plurality of corner cavities, wherein each corner cavity of the plurality of corner cavities is extended from a corresponding blowing hole of the plurality of blowing holes, wherein the corresponding blowing hole is positioned in a space between a corresponding corner suction hole among the plurality of corner suction holes and a suction hole, adjacent to the corresponding corner suction hole, of the plurality of suction holes;

a plurality of edge cavities arranged along a side surface of the gripping plate, wherein the plurality of suction holes further include a plurality of edge suction holes that are arranged along the side surface of the gripping plate, wherein the plurality of blowing holes further include a plurality of edge blowing holes that are arranged along the side surface of the gripping plate, wherein each edge blowing hole of the plurality of edge blowing holes is disposed in a space between corresponding two adjacent edge suction holes of the plurality of edge suction holes, and wherein each edge cavity of the plurality of edge cavities is extended from a corresponding edge blowing hole of the plurality of edge blowing holes; and a plurality of center cavities extended from a plurality of center blowing holes, respectively, wherein the plurality of blowing holes include the plurality of center blowing holes at a central portion of the gripping plate.

* * * * *